United States Patent
Liang et al.

(10) Patent No.: US 8,012,785 B2
(45) Date of Patent: Sep. 6, 2011

(54) METHOD OF FABRICATING AN INTEGRATED CMOS-MEMS DEVICE

(75) Inventors: Kai-Chih Liang, Zhubei (TW); Hua-Shu Wu, Hsinchu (TW); Li-Chun Peng, Hsin-Chu (TW); Tsung-Cheng Huang, Jhubei (TW); Mingo Liu, Hsinchu (TW); Nick Y. M. Shen, Chu-Pei (TW); Allen Timothy Chang, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 101 days.

(21) Appl. No.: 12/429,305

(22) Filed: Apr. 24, 2009

(65) Prior Publication Data
US 2010/0273286 A1  Oct. 28, 2010

(51) Int. Cl.
*H01L 21/00* (2006.01)
*H01L 27/14* (2006.01)

(52) U.S. Cl. .......... 438/50; 438/48; 438/51; 438/52; 438/53; 257/414; 257/415; 257/416; 257/417; 257/418; 257/E27.011; 257/E21.598

(58) Field of Classification Search ............. 438/50–53; 257/414–420, E21.598, E27.011
See application file for complete search history.

(56) References Cited

U.S. PATENT DOCUMENTS

| | | | |
|---|---|---|---|
| 6,946,314 B2 | 9/2005 | Sawyer et al. | |
| 6,949,451 B2 | 9/2005 | Yeo et al. | |
| 2002/0096743 A1* | 7/2002 | Spooner et al. | 257/620 |
| 2002/0098611 A1* | 7/2002 | Chang et al. | 438/50 |
| 2002/0192927 A1* | 12/2002 | Yamada | 438/460 |
| 2003/0139018 A1* | 7/2003 | Silverbrook | 438/455 |
| 2007/0287215 A1* | 12/2007 | Utsumi et al. | 438/51 |
| 2008/0119000 A1* | 5/2008 | Yeh et al. | 438/50 |

* cited by examiner

*Primary Examiner* — Michael S Lebentritt
*Assistant Examiner* — Karen M Kusumakar
(74) *Attorney, Agent, or Firm* — Haynes and Boone, LLP (57) ABSTRACT

An embodiment of a method is provided that includes providing a substrate having a frontside and a backside. A CMOS device is formed on the substrate. A MEMS device is also formed on the substrate. Forming the MEMS device includes forming a MEMS mechanical structure on the frontside of the substrate. The MEMS mechanical structure is then released. A protective layer is formed on the frontside of the substrate. The protective layer is disposed on the released MEMS mechanical structure (e.g., protects the MEMS structure). The backside of the substrate is processed while the protective layer is disposed on the MEMS mechanical structure.

20 Claims, 6 Drawing Sheets

METHOD OF FABRICATING AN INTEGRATED CMOS-MEMS DEVICE

BACKGROUND

The present disclosure relates generally to microelectromechanical system (MEMS) technology and more specifically to fabrication of MEMS devices using complementary-metal-oxide-semiconductor (CMOS) compatible processes.

A variety of monolithic (e.g., single substrate) CMOS-MEMS integration methods have been studied as providing benefits for integrating CMOS and MEMS devices onto a single substrate, such as for system-on-chip (SOC) devices. The integration may provide for lower parasitics (e.g., resistance, inductance, and capacitance), lower cost, and/or increased performance. One approach developed for the integration of CMOS and MEMS devices and processes includes formation of a CMOS device using typical processing and then forming the MEMS device. In the approach, during the MEMS formation, the backside of a substrate (e.g., wafer) is processed (e.g., bulk micromachining) followed by processing on the front-side of the substrate (e.g., surface micromachining). Though this approach purports to create advantages in not damaging the MEMS device by subsequent processing, it also includes disadvantages. The approach, as well as other conventional fabrication processes, requires substantial handling of the wafers (e.g., numerous taping, de-taping processes) to form the final device. Such handling may introduce risks of substrate breakage, glue layer degradation, and/or other possible defects. Conventional approaches also may require etch stop layers to be used when etching the backside of the substrate (e.g., bulk micromachining) requiring additional considerations of etch selectivity, post-etching surface roughness issues, and/or other possible issues.

Therefore, what is needed is an improved method of integrated CMOS-MEMS fabrication.

DETAILED DESCRIPTION

The present disclosure relates generally to forming a MEMS device, and more particularly a method of forming a MEMS device on a semiconductor substrate including CMOS circuitry. It is understood, however, that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Furthermore, descriptions of a first layer "on," "overlying," (and like descriptions) a second layer includes embodiments where the first and second layer are in direct contact and those where one or more layers are interposing the first and second layer. The present disclosure refers to MEMS devices; however, one of ordinary skill in the art will find other applicable technologies that may benefit from the disclosure such as, nanoelectromechanical systems (NEMS) devices. Furthermore, the MEMS device structure or design illustrated is exemplary only and not intended to be limiting in any manner.

Figure 1:
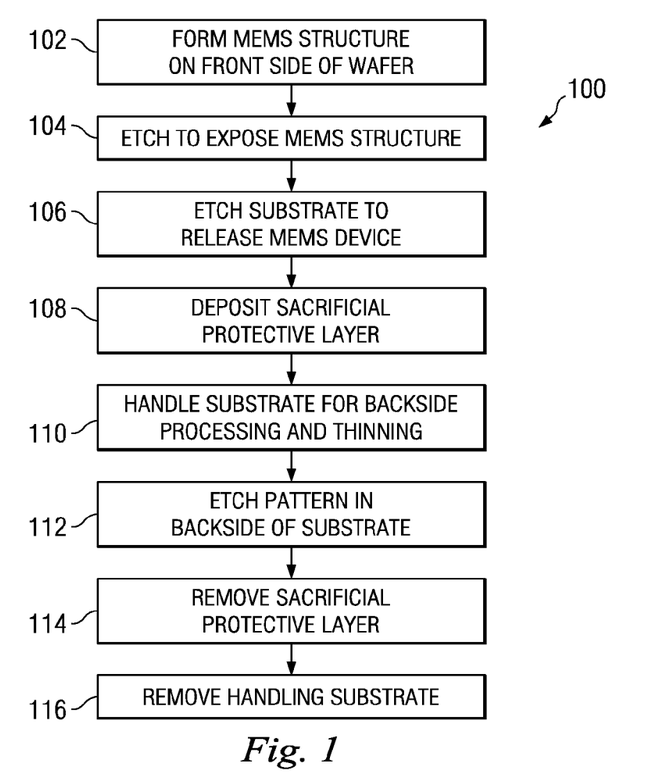
FIG. 1 is a flow chart illustrating an embodiment of a method of integrated CMOS-MEMS fabrication.

FIG. 1 provides a flow chart illustrating a method 100 of fabricating a MEMS device. FIGS. 2-10 illustrate an embodiment of a MEMS device according to the method of FIG. 1. The method 100 provides for a CMOS-MEMS integrated fabrication process. One of ordinary skill in the art would recognize additional steps that may be included in the method 100 and/or omitted from the method 100. The method 100 and the corresponding FIGS. 2-10 are exemplary only and not intended to be limiting. For example, the MEMS device structure depicted in FIGS. 2-10 is exemplary only and similar methods may be used to form any MEMS device. CMOS circuitry may be included in the device depicted in FIGS. 2-10.

Figure 2:
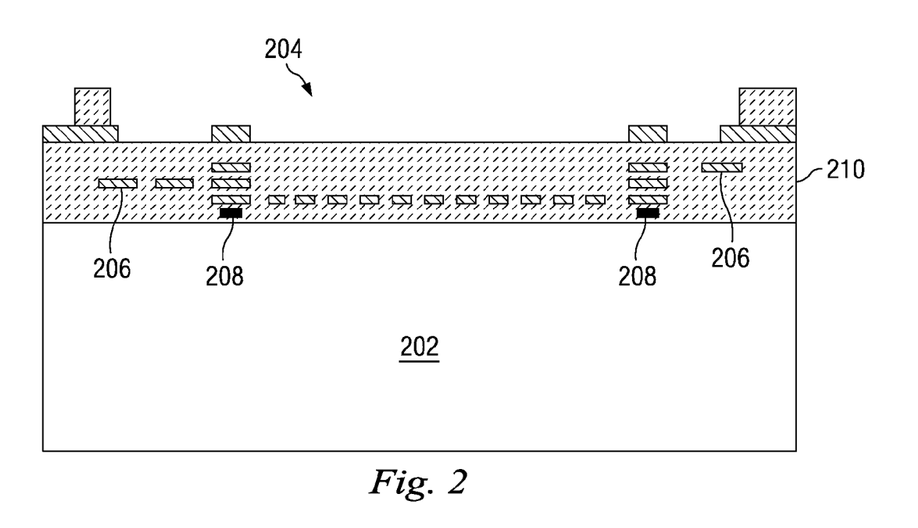
FIGS. 2-10 are cross-sectional views illustrating embodiments of a device according to steps of the method of FIG. 1.
Figure 3:
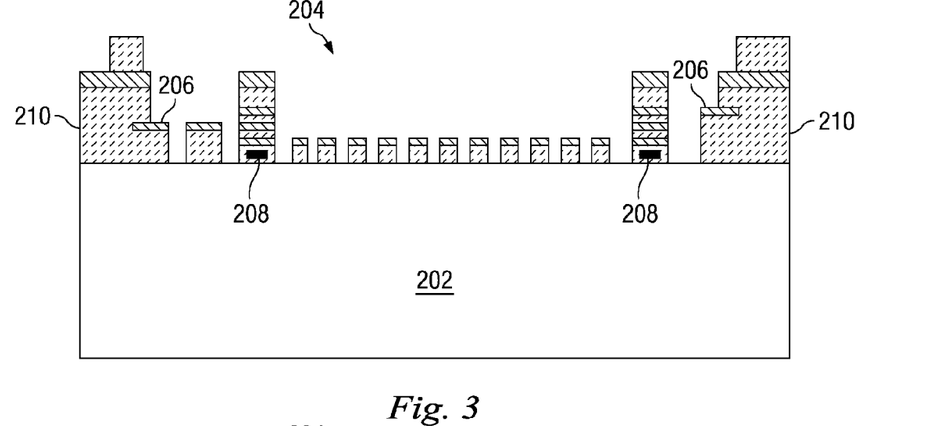
Figure 4:
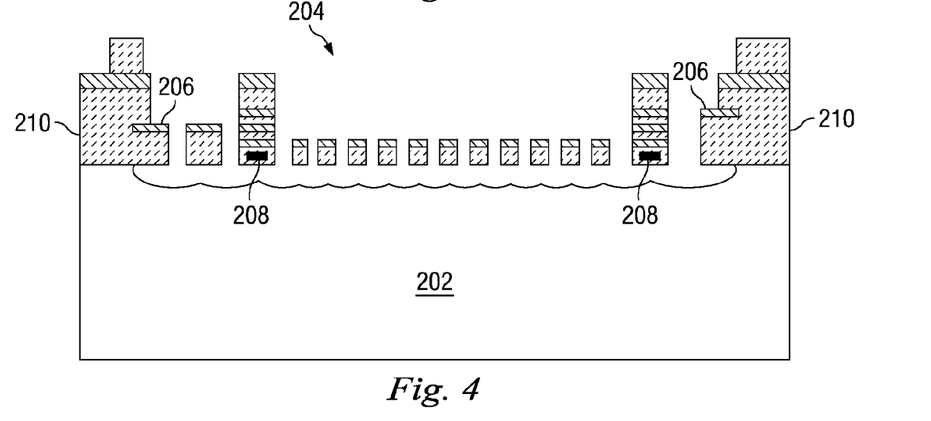

The method 100 begins at step 102 where a MEMS structure is formed on the front side of a substrate (e.g., a semiconductor wafer). It should be noted that the terms "front" and "back" are relative only and provide no absolute direction. Referring to the example of FIG. 2, illustrated is a substrate 202 with a MEMS device 204 (a MEMS device in whole or in part) formed thereon. The substrate 202 may also include one or more CMOS devices such as transistors (e.g., NMOS and/or PMOS transistors). The substrate 202 may include circuitry associated with the transistors such as interconnect layers (e.g., metal lines and vias) and interlayer dielectric layers (ILD). In an embodiment, the substrate 202 is silicon in a crystalline structure. In alternative embodiments, the substrate 202 may include other elementary semiconductors such as germanium, or includes a compound semiconductor such as, silicon carbide, gallium arsenide, indium arsenide, and indium phosphide. The substrate 202 may include a silicon on insulator (SOI) substrate. One or more isolation features may be formed on the substrate 202.

The MEMS device 204 includes a plurality of elements formed on metal, polysilicon, dielectric, and/or other materials known in the art. The MEMS device 204 may include materials typically used in a conventional CMOS fabrication process. In the illustrated embodiment, the MEMS device 204 includes metal elements 206 and polysilicon elements 208. A dielectric layer 210 is disposed on the substrate 202. In an embodiment, the dielectric layer 210 includes oxide. However, any configuration of MEMS device may be possible depending on the desired functionality. One or more of the elements depicted may be designed to provide MEMS mechanical structures of the MEMS device. The MEMS mechanical structures include structures or elements operable for mechanical movement (e.g., selected metal elements 206). The MEMS device 204 may be formed using typical processes used in CMOS fabrication, for example, photolithography, etching processes (e.g., wet etch, dry etch, plasma etch), deposition processes, plating processes, and/or other suitable processes.

The method 100 then proceeds to step 104 where an etching process is performed to expose the MEMS device, or portion thereof. The step 104 may include a photolithography step that defines a pattern for the etching process. The etching process may remove dielectric (e.g., oxide) exposing one or more elements of the MEMS device. Referring to the example of FIG. 3, the dielectric layer 210 is etched. The metal elements 206 are exposed. The metal elements 206 may be a portion of the MEMS mechanical structure (e.g., the metal elements 206 may be movable parts of the MEMS device).

The method 100 then proceeds to step 106 where the substrate is etched to release the MEMS mechanical structure of the MEMS device. In an embodiment, approximately 5 to 20 µm of substrate is etched. The etch may be an isotropic etch (e.g., of silicon). The releasing of the MEMS mechanical structure and elements thereof may include removing surrounding material such that a MEMS mechanical structure or element thereof, is capable of movement. Referring to the example of FIG. 4, the substrate 202 is etched releasing the MEMS mechanical structure of the MEMS device 204.

The method 100 then proceeds to step 108 where a sacrificial layer is deposited on the substrate. The sacrificial layer may be disposed on the MEMS device and protect the MEMS device from subsequent processing, thus acting as a protective layer. In particular, the sacrificial layer may protect a MEMS mechanical structure (e.g., moving elements of a MEMS device) from damage caused by subsequent processing. The sacrificial layer may be formed using deposition processes known in the art such as, spin-on coating, physical vapor deposition, and/or other suitable processes. A chemical mechanical polish (CMP) process may be performed to form a planar surface of the sacrificial layer. In an alternative embodiment, an etching process, such as a plasma etch, may be used to planarize the substrate and the sacrificial layer. The sacrificial layer may be deposited on the substrate in the region of MEMS device formation. In an embodiment, the sacrificial layer is also formed over a portion of the substrate including a CMOS device.

Figure 5:
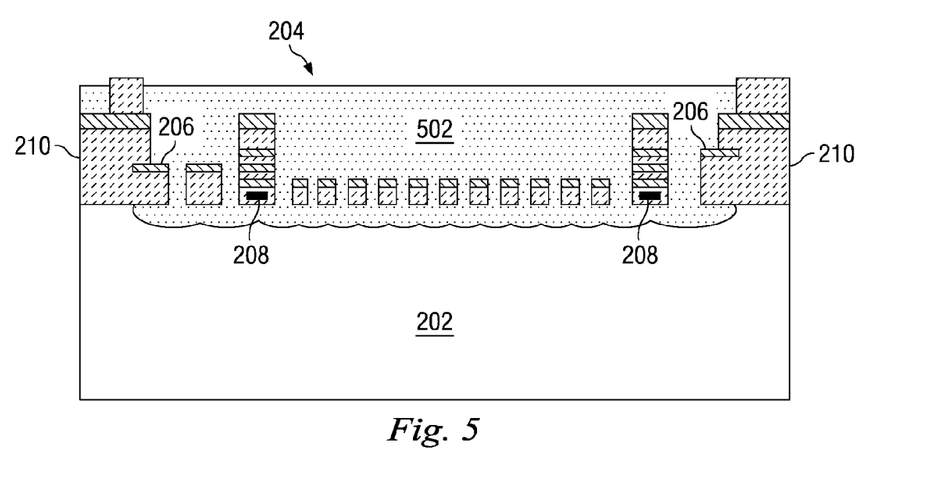
Figure 6:
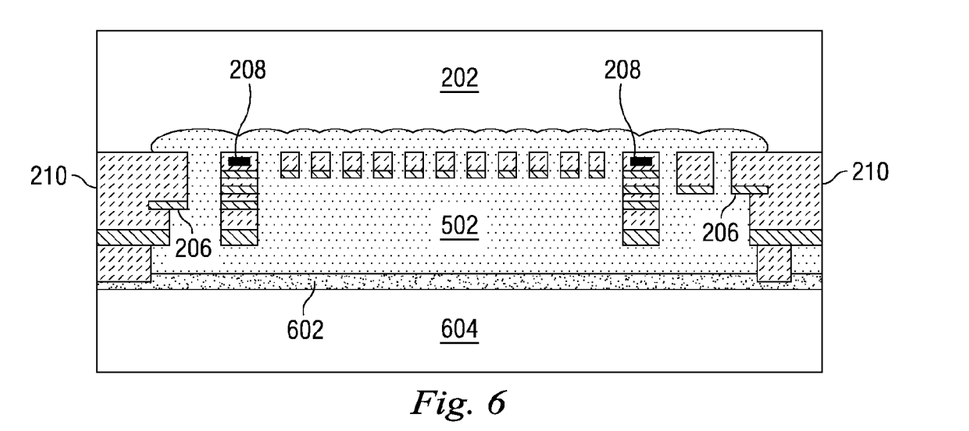

Referring to the example of FIG. 5, a sacrificial layer 502 is formed on the substrate 202. The sacrificial layer 502 may protect (e.g., encase) the MEMS device 204. In particular, the sacrificial layer 502 may protect (e.g., encase) the MEMS mechanical structure. The sacrificial layer 502 may include a polymer material. In an embodiment, the sacrificial layer 502 includes photoresist. In an embodiment, the sacrificial layer 502 includes a polymer of photoresist (e.g., but does not include a photosensitive component such as, a photoacid generator (PAG) element). In an embodiment, the sacrificial layer 502 is between approximately 5 and 6 µm. In an embodiment, the sacrificial layer 502 is between approximately 8 and 9 µm. The sacrificial layer 502 thus may restrict and/or eliminate movement of the MEMS mechanical structure.

The method 100 then proceeds to step 110 where the substrate is prepared for thinning and backside processing. Step 110 may include flipping the substrate, a glue process (e.g., taping the substrate), mounting the substrate to a handling substrate (described herein as a handling wafer), and/or thinning the substrate such as by a back lapping process performed using a grinder. In an embodiment, the target substrate (e.g., having the MEMS device formed thereon) is thinned to approximately 50 to 400 µm. A substrate provided in a typical CMOS process may be approximately 725 µm. The glue process may include taping (e.g., organic material) or temporary bonding (e.g., inorganic material). Referring to the example of FIG. 6, the substrate 202 is flipped such that the backside of the substrate is exposed for processing. A glue layer 602 is applied to the frontside of the substrate. In an embodiment, the glue layer 602 is applied to the surface of the sacrificial layer 502. A handling substrate 604 is attached to the substrate 202 using the glue layer 602.

The method 100 then proceeds to step 112 where the backside of the substrate is etched. A pattern may be etched in the backside of the substrate using one or more processes including photolithography and/or etching processes. In an embodiment, a first pattern including a cavity is formed using a photolithography and etch process, and, subsequently, a second pattern including a vent pattern is formed using a second photolithography and etch process. The etch processes may remove a portion of the substrate (e.g., silicon wafer). In other embodiments of the method 100, other suitable processes may be performed on the backside of the substrate.

Figure 7:
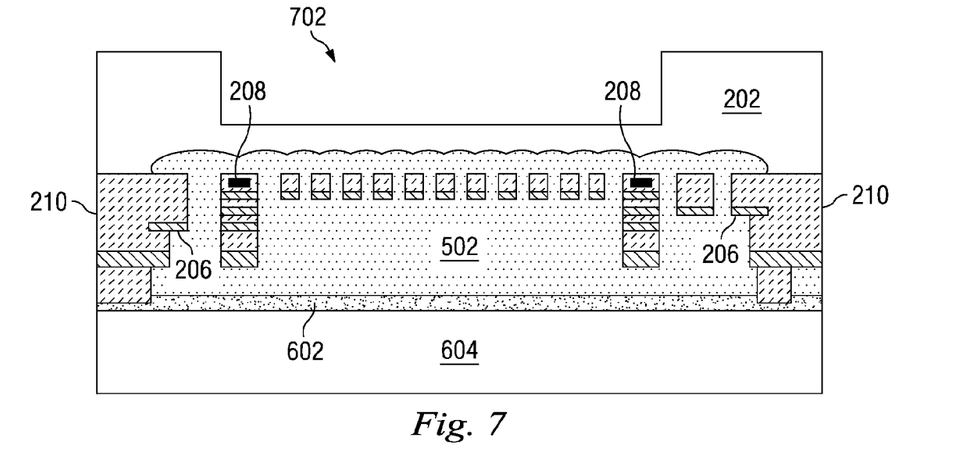
Figure 8:
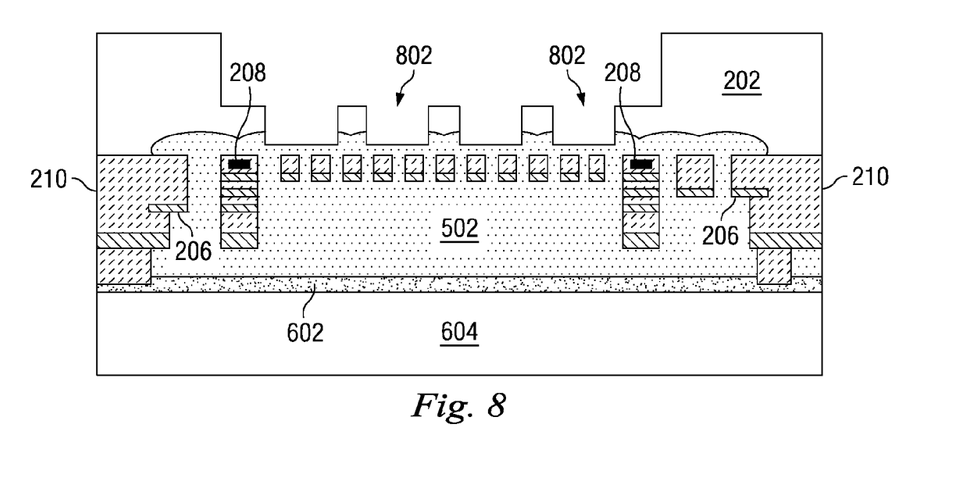
Figure 9:
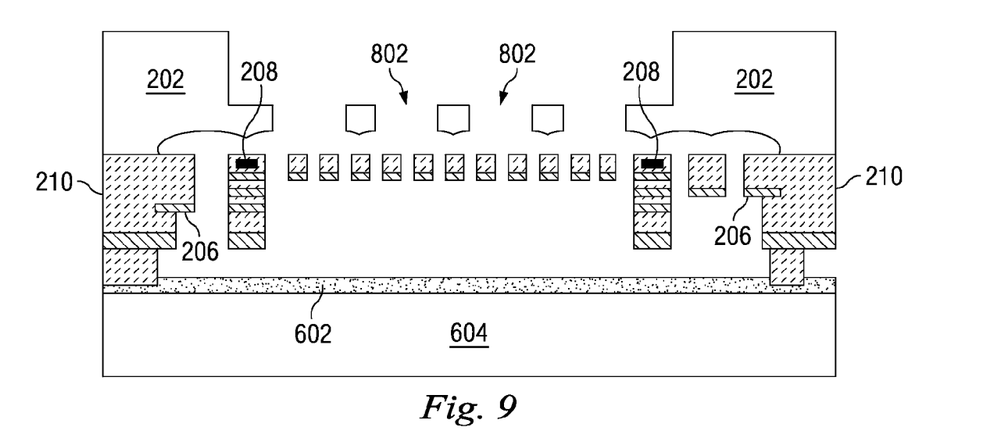

Referring to the examples of FIGS. 7 and 8, forming a pattern in the backside of the substrate 202 is illustrated. In FIG. 7, a cavity 702 is formed in the backside of the substrate 202. The alignment tolerance can be below approximately 2 µm with an etch depth of between approximately 500 and 700 µm. In FIG. 8, a vent pattern 802 is formed. The vent pattern 802 is formed within the cavity pattern 702. The vent pattern 802 may expose a portion of the sacrificial layer 502.

It is noted that the sacrificial layer 502 may provide protection of the MEMS device 204 from the backside processing (as well as protection from the glue layer 602 and handling substrate 604). The sacrificial layer 502 may act as a buffering layer during an etch of the backside of the substrate 202. For example, during the formation of the vent pattern 802, the sacrificial layer 502 protects the MEMS structure, e.g., moving parts (MEMS mechanical structure) 1002 described below with reference to FIG. 10 and/or the substrate 202, from overetching. As the layer 502 is sacrificial, the amount and/or uniformity of the etching of the sacrificial layer 502 may be non-critical. The sacrificial layer 502 may allow for a user of the process to avoid considerations (e.g., during fabrication of the vent pattern 802) of etch selectivity and/or wafer level uniformity that may arise from processing the backside of a substrate without a sacrificial layer as any etching of a MEMS device (e.g., in particular, a MEMS mechanical structure) may be critical, for example, as described below with reference to FIG. 12.

The method 100 then proceeds to step 114 where the sacrificial layer is removed from the substrate. The removal of the sacrificial layer may release the MEMS mechanical structure of the MEMS device. The sacrificial layer may be removed using a dry clean process, a plasma etch (e.g., $O_2$ plasma etch), and/or other suitable processes. Referring to the example of FIG. 9, the sacrificial layer 502 is removed from the substrate 202. The MEMS device 204 is released.

The method 100 then proceeds to step 116 where the substrate is removed from the handling substrate. The substrate may also be flipped such that the "front" side is facing up. Subsequent processing including packaging the device may be performed. Referring to the example of FIG. 10, the handling substrate 604 is removed. The glue layer 602 is also removed from the substrate 202.

Figure 10:
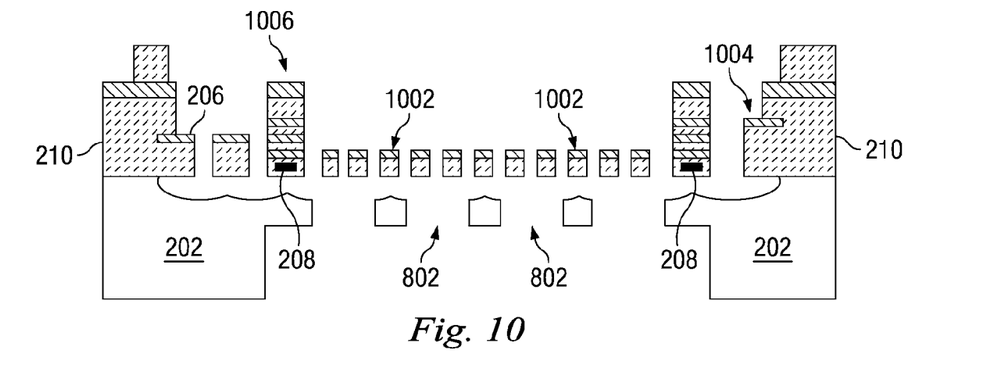

As the MEMS device 204 is released, for example, a MEMS mechanical structure (or moving parts) 1002 including metal elements 206 are provided. The MEMS device 204 also includes an anchor element 1004 and a stack of films 1006 that may be formed using standard CMOS processing. However, any MEMS device design may be possible.

Therefore, in an embodiment, the method 100 allows for performing standard CMOS processing, for example, to form one or more CMOS and MEMS devices on the substrate (e.g., transistors). After forming a CMOS device and/or associated circuitry, an etch process is performed to pattern and release the primary MEMS mechanical structures also formed on the substrate. A sacrificial material, for example, photoresist, is then disposed on the substrate. The sacrificial material may partially or completely fill the etched regions of the substrate; thus, the sacrificial material may protect the MEMS device, and in particular the MEMS mechanical structure, from subsequent processing. After planarization of the sacrificial material, the substrate may be attached to a handling substrate. The frontside of the substrate may be coupled to the handling substrate, for example, using a glue process. After gluing, further processing of the backside of the substrate may be performed, for example, etch and photolithography processes known in the art. The MEMS structure is protected by the sacrificial layer during the subsequent backside processing.

Though illustrated as allowing for backside processing after the front side of the wafer is fully or nearly fully processed, other embodiments are possible. Furthermore, illustrated is a method of fabricating a CMOS device before fabrication of a MEMS device; however, other embodiments are possible.

For example, in an alternative embodiment of the method 100, two stages of wafer handling (e.g., adhesion to a handling substrate) may be required. For example, the handling substrate may be affixed to the frontside of the substrate (e.g., target substrate or substrate on which a MEMS device is formed) and the backside of the substrate is processed. Subsequently, the backside of the target substrate is affixed to a handling substrate and the frontside of the wafer processed. The alternative embodiments of the method 100 may include use of a sacrificial layer to protect a MEMS device or portions thereof. In the embodiments, the sacrificial layer protects a MEMS device or portion thereof (e.g., including released moveable elements) from subsequent processing.

The method 100 may be compared to other embodiments of monolithic CMOS-MEMS fabrication process flows requiring additional process steps. In such embodiments, processes associated with formation of a MEMS device may be performed on a front side of a wafer. The MEMS device however, is not released. The substrate is then flipped and attached to a handling wafer. The wafer may then be thinned and various processes performed (e.g., photolithography and etch) on the backside of the wafer. The wafer is then removed from the handling substrate. The wafer is subsequently reattached to a handling substrate such that the frontside of the wafer is exposed for processing. Various processes may then be done to pattern the frontside of the wafer and in particular, to release the MEMS device. The wafer, after release of the MEMS device, is then removed from the handling substrate. Therefore, these embodiments, in contrast to the method 100, require wafer handling procedures to be performed twice—first attaching the front side of the wafer to a handling substrate to process the backside of the wafer, and then again to attach the backside of the wafer to a handling substrate to process the frontside of the wafer—e.g., to release the MEMS device. This additional handling may lead to increased risks and costs in the fabrication process. In contrast, the method 100 allows for release of the elements of the MEMS device at the time of their formation, if desired.

Figure 11:
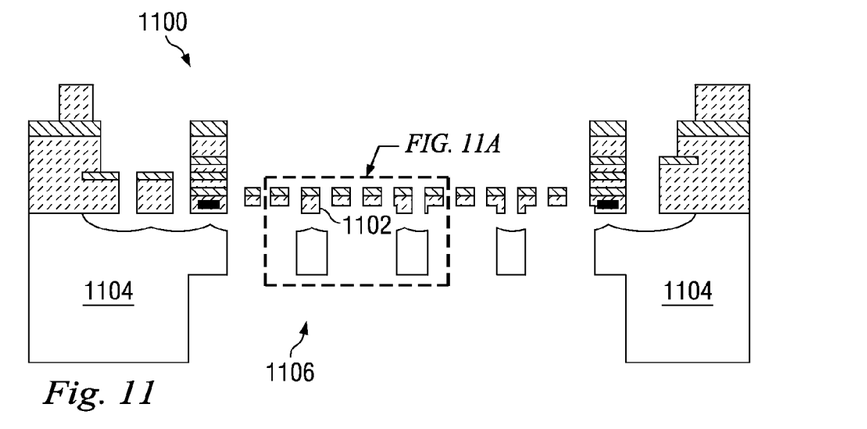
FIG. 11 illustrates a cross-sectional view of an embodiment of a MEMS device fabricated with conventional processes.
Figure 11A:
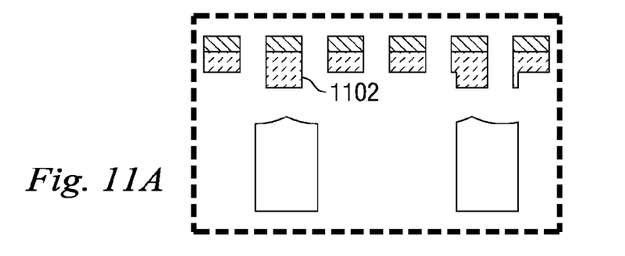
FIG. 11A illustrates an enlarged view of a portion of FIG. 11.
Figure 12:
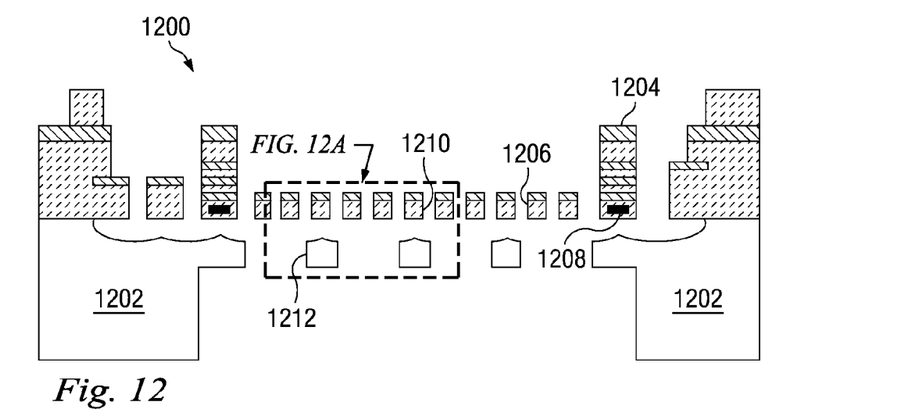
FIG. 12 illustrates a cross-sectional view of an embodiment of a MEMS device which may be fabricated using the method of FIG. 1.
Figure 12A:
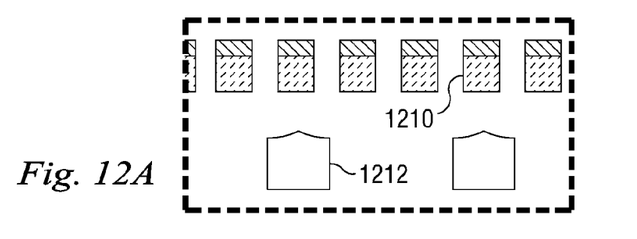
FIG. 12A illustrates an enlarged view of a portion of FIG. 12.

Referring now to FIGS. 11 and 12, illustrated are MEMS devices 1100 and 1200 respectively. The MEMS device 1200 includes a substrate 1202, metal elements 1204, dielectric elements 1206, and polysilicon elements 1208. The MEMS device 1200 may be formed using the processes described above with reference to FIG. 1. The substrate 1202 and the elements 1204, 1206, and 1208 may be substantially similar to the substrate 202, and elements 206, 210, and 208 respectively, which are described in further detail above. The MEMS device 1200 illustrates that moving elements 1210 of a MEMS mechanical structure are formed that are substantially rectangular in shape. The MEMS device 1200 further illustrates uniform substrate elements 1212 disposed between vent holes provided in the substrate 1202.

The MEMS device 1200 may be contrasted to the MEMS device 1100 which illustrates overetch symptoms in moving part elements 1102 of the MEMS device 1100. The overetch may occur because the MEMS device 1100 is formed using a process where the MEMS device 1100 is released by etching a substrate 1104 after the backside of the substrate 1104 has been processed (e.g., pattern 1106 formed). During the processing of the backside of the substrate 1104, certain areas of the moving part elements 1102 (e.g. a dielectric layer included in the moving part elements 1102) may be unintentionally processed to become vulnerable to etching. When the substrate 1104 is etched to release the MEMS device 1100, the etch may attack the moving part elements 1102 (e.g., a dielectric layer included in the moving part elements 1202). The substrate 1104 may also be overetched.

Figure 13:
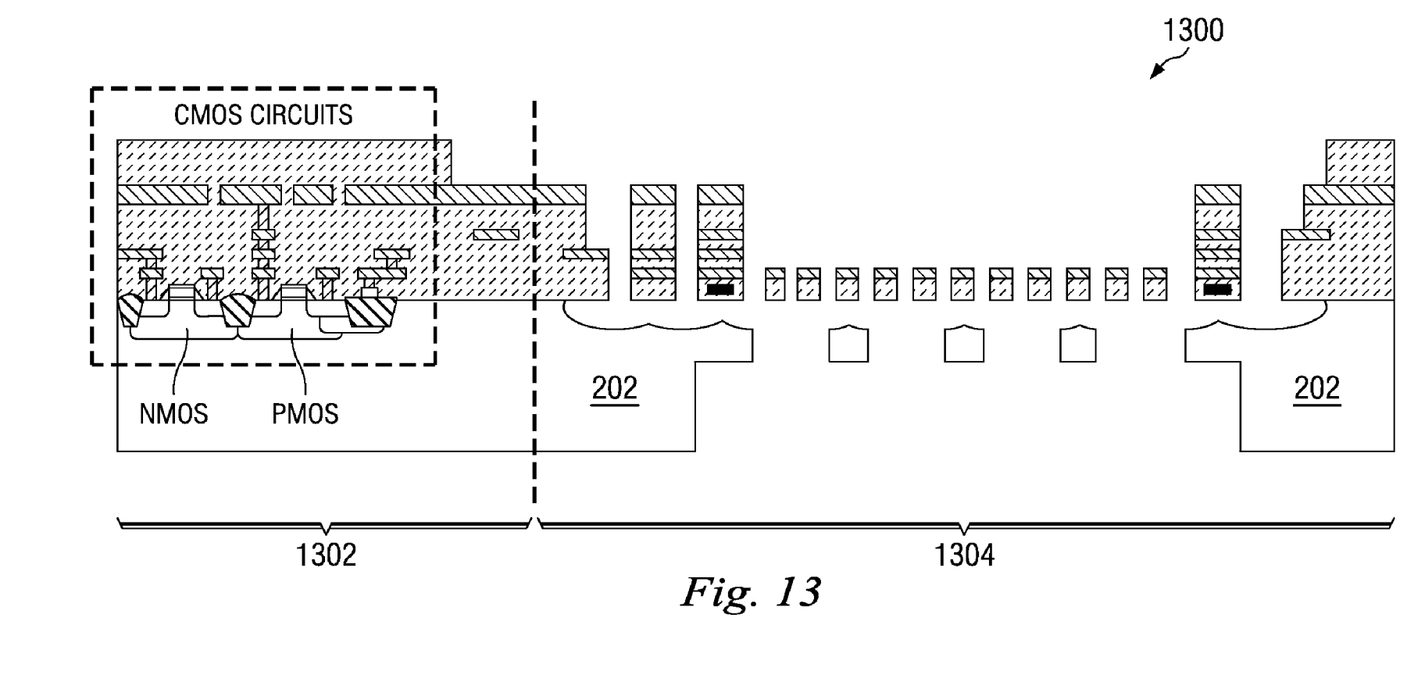
FIG. 13 illustrates a cross-sectional view of an embodiment of a integrated (e.g., monolithic) CMOS-MEMS device.

Referring now to FIG. 13, illustrated is a device 1300 including a CMOS portion 1302 and a MEMS portion 1304. The device 1300 may be formed using the method 100 or portion thereof, described above with reference to FIG. 1. The device 1300 illustrates transistor devices (and associated circuitry (e.g., interconnects) disposed in the CMOS portion 1302 and a MEMS device disposed in the MEMS portion 1304. The CMOS portion 1302 and the MEMS portion 1304 are on the same substrate 202 (e.g., the device 1300 is an integrated or monolithic CMOS-MEMS device). The device 1300 is exemplary only: any configuration of devices, design of MEMS device, and the like may be provided. The moving parts, anchor, and CMOS film stack of the device of the MEMS portion 1304 may be substantially similar to the elements 1002, anchor element 1004, and film stack 1006, described above with reference to FIG. 10. The wafer backside cavity pattern may be substantially similar to a pattern described above with reference to step 112 of FIG. 1.

Therefore, provided is a MEMS device and method of fabrication thereof. The method of fabrication provides for the fabrication of a MEMS device on the same substrate as a CMOS semiconductor device. The fabrication process includes conventional CMOS processes and/or CMOS compatible processes and/or materials. Embodiments of the fabrication process allow for a sacrificial layer to be formed on a frontside of a substrate. The sacrificial layer may protect a MEMS device, portion of a MEMS device such as a MEMS mechanical structure, and/or other devices which may be formed on the substrate, while the backside of the wafer is processed (e.g., patterned). Therefore, the MEMS device may be released and then subsequently protected by the sacrificial layer during further processing. The fabrication process may reduce the handling of substrate (e.g., tape/de-tape processes). The sacrificial layer also provides a buffer layer during subsequent processing, such as etching the backside of the substrate, that reduces and/or eliminates the overetch of the MEMS devices or portions of the substrate during the patterning of the backside of the wafer. Embodiments of the fabrication method allow for dry etch/clean processes to release moving structures of the MEMS device by removing a sacrificial layer after the fabrication processes are complete.

Thus, an embodiment of a method is provided. The method includes providing a substrate having a frontside and a backside. A CMOS device is formed on the substrate. A MEMS device is also formed on the substrate. The MEMS device is formed by forming a MEMS mechanical structure (e.g., an element designed to move) on the frontside of the substrate. The MEMS mechanical structure is then released (e.g., surrounding material removed such that the structure is capable of movement). A protective layer is formed on the frontside of the substrate and is disposed on the released MEMS mechanical structure. The backside of the substrate is processed (e.g., etched) while the protective layer is disposed on the MEMS mechanical structure.

What is claimed is:

1. A method, comprising:
providing a substrate having a frontside and a backside;
forming a CMOS device on the substrate; and
forming a MEMS device on the substrate, wherein the forming the MEMS device includes:
  forming a MEMS mechanical structure on the frontside of the substrate;
  releasing the MEMS mechanical structure to form a cavity of the MEMS device having at least one moveable part disposed in the cavity;
  depositing a protective layer on the frontside of the substrate, wherein the protective layer is disposed on the released MEMS mechanical structure and in the cavity; and
processing the backside of the substrate while the protective layer is disposed on the MEMS mechanical structure.

2. The method of claim 1, further comprising:
completely removing the protective layer from the substrate.

3. The method of claim 1, wherein the depositing the protective layer includes depositing a polymer material.

4. The method of claim 3, wherein the polymer material is photoresist.

5. The method of claim 1, wherein the processing the backside of the substrate includes etching the substrate to expose a portion of the protective layer.

6. The method of claim 1, wherein the releasing the MEMS mechanical structure includes releasing the at least one moving part of the MEMS device, and wherein the protective layer encases the at least one moving part.

7. The method of claim 1, wherein the releasing the MEMS mechanical structure includes etching the frontside of the substrate.

8. The method of claim 1, wherein the forming the MEMS device further includes:
planarizing the deposited protective layer; and
attaching the substrate to a handling substrate, wherein the attaching includes applying a glue layer to the planarized protective layer.

9. The method of claim 1, wherein the forming the CMOS device includes forming one of an NMOS transistor and a PMOS transistor.

10. The method of claim 1, wherein the forming the CMOS device occurs prior to the forming the MEMS device.

11. A method of fabricating a device, comprising:
providing a substrate having a frontside and a backside;
forming a movable element of a MEMS device on the frontside of the substrate;
releasing the movable element;
depositing a sacrificial layer on the frontside of the substrate, wherein the sacrificial layer surrounds the moveable element;
attaching the frontside of the substrate to a handling wafer, wherein the attaching the frontside of the substrate includes providing a glue layer on the sacrificial layer;
etching the backside of the substrate while the frontside of the substrate is attached to the handling wafer; and
removing the handling wafer, glue layer, and the sacrificial layer from the substrate.

12. The method of claim 11, further comprising:
forming a transistor on the frontside of the substrate.

13. The method of claim 11, wherein the sacrificial layer includes a polymer of a photoresist.

14. The method of claim 11, wherein the removing the sacrificial layer includes a dry etch process.

15. The method of claim 14, wherein the dry etch process is a plasma etch.

16. The method of claim 11, wherein the backside of the substrate is not attached to a handling wafer while forming the MEMS device.

17. A method, comprising:
providing a substrate including a frontside and a backside;
forming a transistor on the frontside of the substrate;
forming a MEMS structure on the frontside of the substrate;
etching the frontside of the substrate to release the MEMS structure;
forming a sacrificial layer on the frontside of the substrate, wherein the sacrificial layer is formed on the released MEMS structure and wherein the sacrificial layer includes an interface with the frontside of the substrate;
planarizing the sacrificial layer to form a first surface;
attaching the first surface to a handling wafer;
etching the backside of the substrate to expose the sacrificial layer; and
removing the sacrificial layer from the substrate.

18. The method of claim 17, wherein the etching the backside of the substrate includes etching a portion of the sacrificial layer.

19. The method of claim 17, wherein the MEMS structure includes elements including metal and dielectric.

20. The method of claim 17, wherein the MEMS structure includes at least one moveable part which is encased by the sacrificial layer.

* * * * *